United States Patent [19]
Zenke

[11] Patent Number: 5,700,738
[45] Date of Patent: Dec. 23, 1997

[54] METHOD FOR PRODUCING A SEMICONDUCTOR DEVICE

[75] Inventor: Masanobu Zenke, Tokyo, Japan

[73] Assignee: NEC Corporation, Tokyo, Japan

[21] Appl. No.: 625,825

[22] Filed: Apr. 1, 1996

[30] Foreign Application Priority Data

Mar. 31, 1995 [JP] Japan .................................. 7-075120

[51] Int. Cl.$^6$ .................................................. H01L 21/285
[52] U.S. Cl. ........................................... 438/653; 437/685
[58] Field of Search .................................. 437/192, 189, 437/245, 246; 118/715

[56] References Cited

U.S. PATENT DOCUMENTS

| | | | |
|---|---|---|---|
| 5,238,499 | 8/1993 | van der Ven et al. | 118/724 |
| 5,326,725 | 7/1994 | Sherstinsky et al. | 437/225 |
| 5,436,200 | 7/1995 | Tanaka | 437/192 |

FOREIGN PATENT DOCUMENTS

| | | |
|---|---|---|
| 1-222052 | 9/1989 | Japan . |
| 4-171719 | 6/1992 | Japan . |

*Primary Examiner*—John Niebling
*Assistant Examiner*—C. Everhart
*Attorney, Agent, or Firm*—Sughrue, Mion, Zinn, Macpeak & Seas, PLLC

[57] ABSTRACT

In a method and an apparatus for producing a semiconductor device, means is provided for adding an oxidizing gas to an inactive gas to be fed to the sides of a wafer. Before a metal film is formed on the front of the wafer, the oxidizing gas oxidizes silicon exposed on the sides and rear of the wafer and unprotected from a raw material gas, thereby forming a silicon oxide film. Hence, even when the metal film is formed on the front of the wafer via an adhesion layer, it is scarcely formed on the sides and rear of the wafer and turns out a minimum of particles. This prevents the metal film from easily coming off without resorting to a great amount of inactive gas.

3 Claims, 4 Drawing Sheets

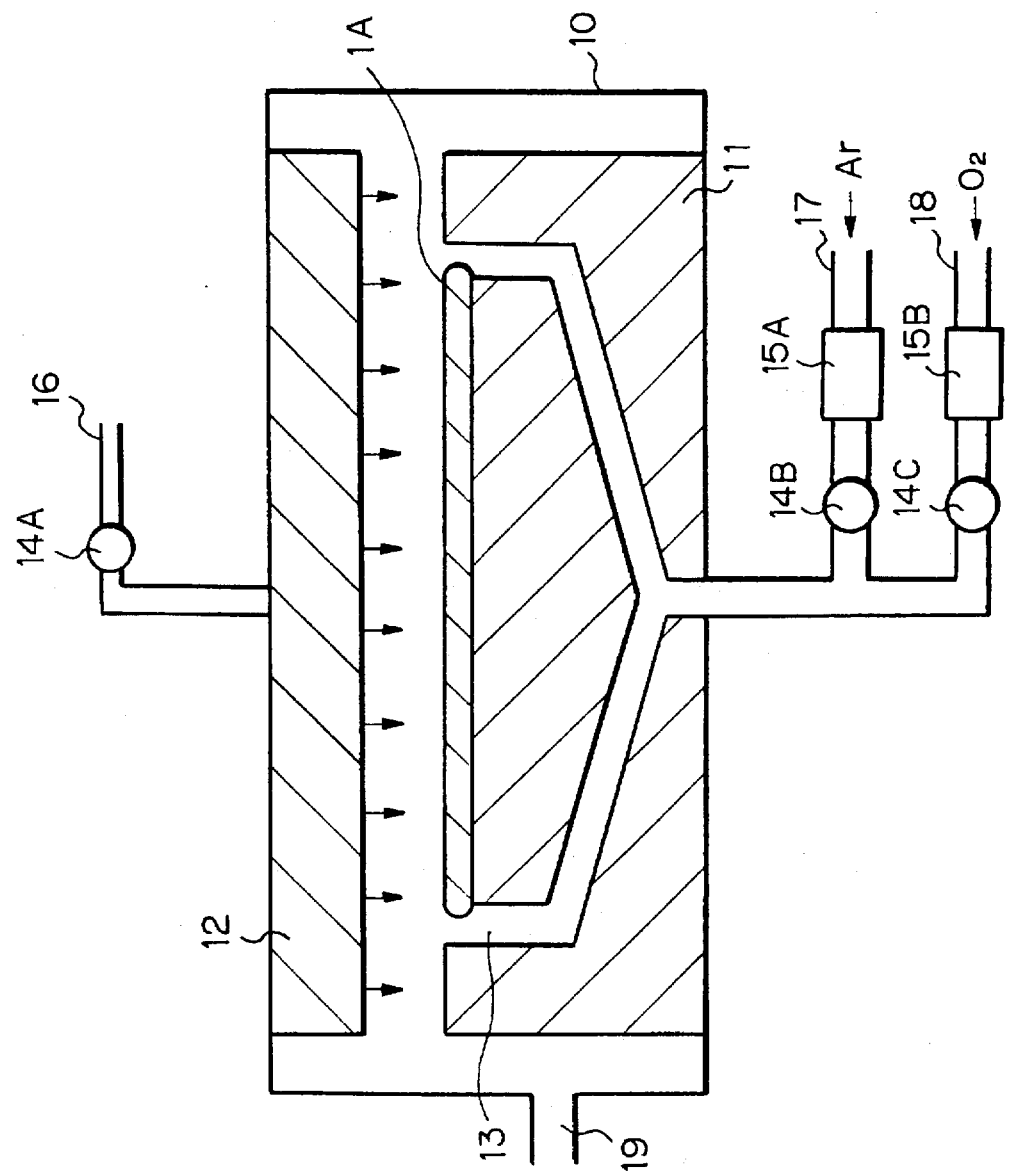

METHOD FOR PRODUCING A SEMICONDUCTOR DEVICE

BACKGROUND OF THE INVENTION

The present invention relates to a method and an apparatus for producing a semiconductor device and, more particularly, to a method and an apparatus for forming a tungsten film on a semiconductor substrate.

In the production of a semiconductor device, a CVD (Chemical Vapor Deposition) process is a predominant process available for filling fine contact holes and via holes formed in a silicon substrate. The CVD process is capable of forming a tungsten film having good step coverage and low resistance. Because the tungsten film is formed on the entire periphery of the substrate, a titanium nitride (TiN), titanium tungsten (TiW) or similar adhesion layer must be formed between the tungsten film and the underlying insulating film in order to insure close adhesion of the two films. The TiN, TiW or similar adhesion layer has poor step coverage because it is usually formed by sputtering. Hence, the adhesion layer is scarcely formed on the sides and rear of a wafer.

On the other hand, the tungsten film formed by the CVD process has better step coverage than TiN or TiW and is formed on the sides and rear of a wafer where the adhesion layer is absent. The tungsten film does not closely adhere to the insulating layer or to the sides and rear of the wafer where silicon is exposed to the outside. Hence, when the tungsten layer is formed on such portions of the wafer, it is likely that the film peels from the wafer and turns out particles, lowering the yield of semiconductor devices.

In light of the above, Japanese Patent Laid-Open Publication No. 1-222052 (referred to as Prior Art 1 hereinafter) teaches that the portions of a silicon substrate where a tungsten film should not grow are covered with covering means made of an insulating material. Prior Art 1 uses a selective metal CVD process. When Prior Art 1 is applied to a blanket CVD process which forms a metal film over the entire periphery of the substrate, there arises the following problem. A tungsten film which lacks in close adhesion is formed also on the covering means. At the time of ingress and egress of a wafer, the tungsten film comes off from the covering means and turns out particles. Of course, a tungsten film will not be formed on the covering means if it can be formed by selective growth. However, regarding quantity production, tungsten films relying on selective growth are not desirable as to the reproducibility of selectivity, among others.

Japanese Patent Laid-Open Publication No. 4-171719 (referred to as Prior Art 2 hereinafter) proposes a method which removes an insulating film from the sides and the peripheral portion of the front of a silicon substrate, covers the remaining portion of the film with an adhesion layer, and then forms a tungsten film by the CVD process. This kind of method has a problem that when the tungsten film is directly formed on the substrate, $WF_6$ and Si react each other and produce a fluoride of silicon. As a result, the tungsten film is likely to come off from the substrate and turn out particles.

There has also been proposed a method which prevents a tungsten film from being formed on the sides and rear of a wafer in a CVD apparatus (referred to as Prior Art 3 hereinafter). The problem with Prior Art 3 is that because an inactive gas must be fed at a high flow rate from the rear of the substrate, the thickness of the film is reduced in the peripheral portion of the front of the substrate, resulting in an irregular thickness distribution.

SUMMARY OF THE INVENTION

It is therefore an object of the present invention to provide an apparatus for producing a semiconductor device capable of reducing the formation of a tungsten film which is easy to come off, without resorting to a great amount of inactive gas to be fed to the sides of a silicon substrate, and a method therefor.

In accordance with the present invention, an apparatus for producing a semiconductor device has a reaction chamber. A susceptor is disposed in the reaction chamber and holds a semiconductor wafer. A shower head faces the susceptor and jets a raw material gas to thereby form a desired film on the semiconductor wafer by the CVD process. Outlet ports adjoin the edges of the semiconductor wafer and feed an inactive gas to the sides of the semiconductor wafer to thereby prevent the raw material gas from turning round to the sides and rear of the semiconductor wafer. Means is provided for adding an oxidizing gas to the inactive gas.

Also, in accordance with the present invention, a method of producing a semiconductor device has the steps of forming an adhesion layer on the front of a silicon substrate via an oxide film, forming, after forming the adhesion layer, a silicon oxide film on the sides and rear of the silicon substrate by using an oxidizing gas, and forming a metal film on the adhesion layer by the CVD process while feeding an inactive gas to the sides of the silicon substrate.

BRIEF DESCRIPTION OF THE DRAWINGS

The above and other objects, features and advantages of the present invention will become more apparent from the following detailed description taken with the accompanying drawings in which:

FIG. 4 is a section of an apparatus embodying the present invention and implemented as a CVD apparatus.

DESCRIPTION OF THE PREFERRED EMBODIMENTS

Figure 1:
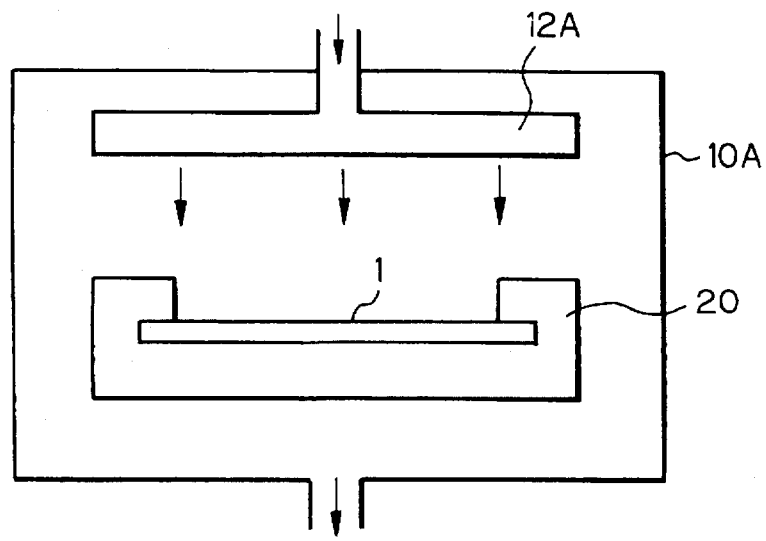
FIG. 1 is a section of a conventional CVD apparatus in accordance with Prior Art 1.

To better understand the present invention, a brief reference will be made to a selective metal CVD apparatus taught in Prior Art 1, shown in FIG. 1. As shown, the apparatus has a reaction chamber 10A in which a silicon substrate 1 is disposed. Covering means 20 is also disposed in the reaction chamber 10A and covers the sides and rear of the substrate 1. The sides and rear of the substrate 1 are specific portions where a tungsten film must be prevented from growing. The covering means 20 is made of an insulating material in order to be free from the deposition of a metal film. A shower head 12A is positioned above the substrate 1 and covering means 20.

Prior Art 1 uses the selective metal CVD process, as stated earlier. When Prior Art 1 is applied to the blanket CVD process which forms a metal film over the entire periphery of the substrate 1, there arises the following problem. A tungsten film which lacks in close adhesion is formed also on the covering means 20 made of an insulating material. At the time of ingress and egress of a wafer, the tungsten film comes off from the covering means 20 and turns out particles. Of course, a tungsten film will not be formed on the covering means 20 if it can be formed by selective growth. However, regarding quantity production, tungsten films relying on selective growth are not desirable as to the reproducibility of selectivity, among others.

Figure 2A:
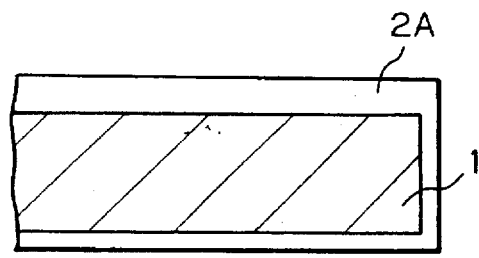
FIGS. 2A–2C are sections of a semiconductor chip and demonstrating a procedure particular to Prior Art 2.
Figure 2B:
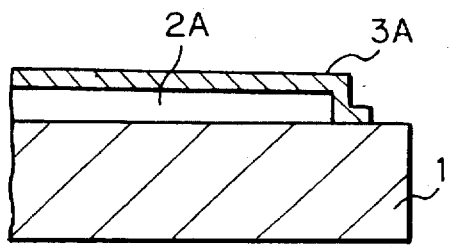
Figure 2C:
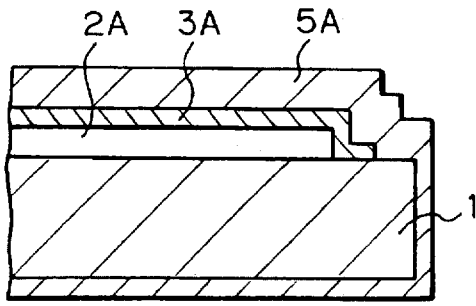

FIGS. 2A–2C demonstrate a method of producing a semiconductor device and disclosed in previously stated Prior Art 2. First, as shown in FIG. 2A, a silicon oxide film 2A is formed on the entire periphery of the silicon substrate 1. Then, as shown in FIG. 2B, the film 2A is removed from the sides, rear and the peripheral portion of the front of the substrate 1 by lithography or etching. Subsequently, an adhesion layer 3A is formed by sputtering on the front of the substrate 1 in such a manner as to cover only the silicon oxide film 2A left thereon. Finally, as shown in FIG. 2C, a tungsten film 5A is formed mainly on the adhesion layer 3A by the CVD process. This kind of method has a problem that when the tungsten film 5A is directly formed on the substrate 1, $WF_6$ and Si react each other and produce a fluoride of silicon, as discussed earlier. As a result, the tungsten film is likely to come off from the substrate and turn out particles.

Figure 3:
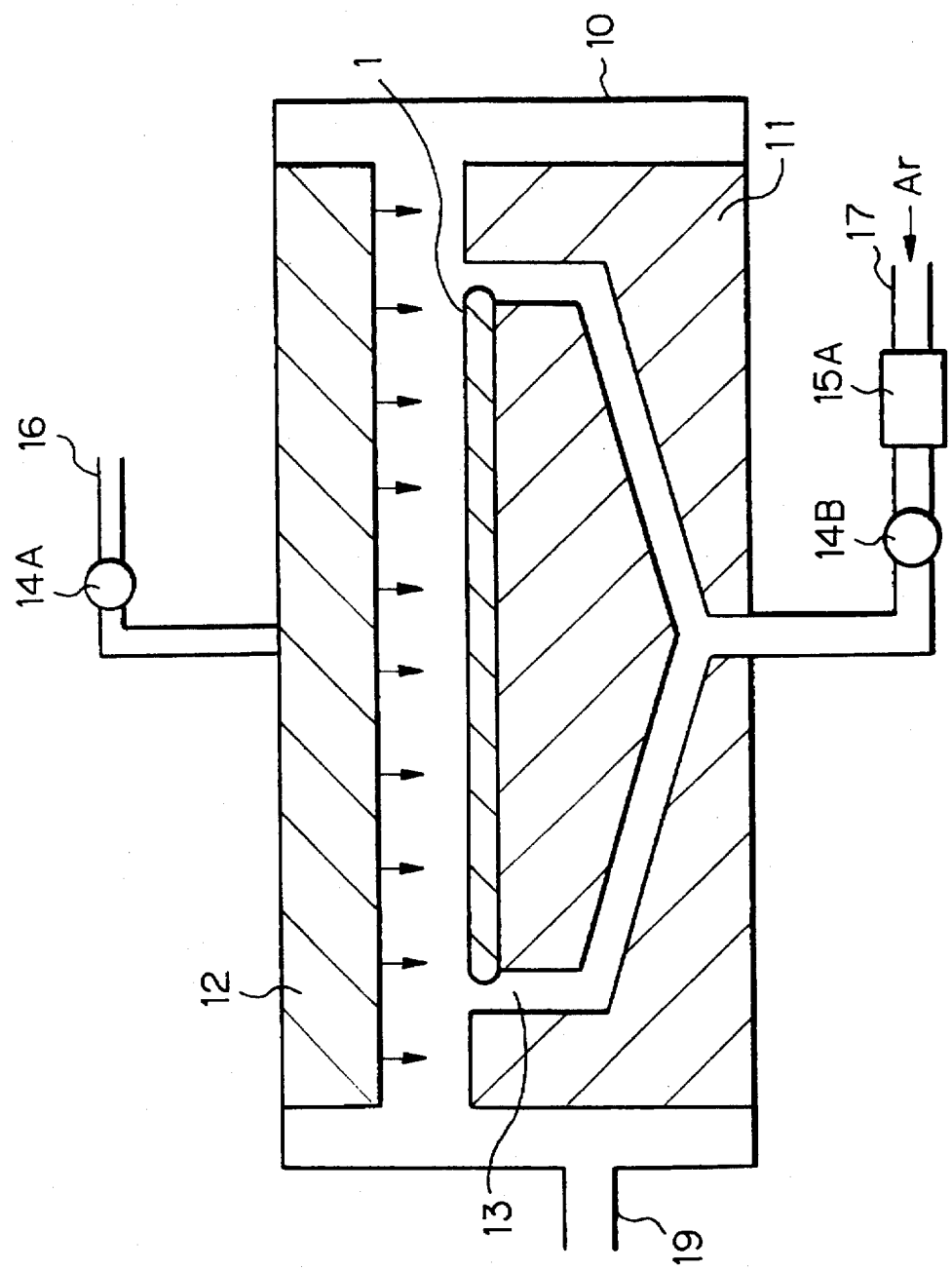
FIG. 3 is a section of a CVD apparatus in accordance with Prior Art 3.

FIG. 3 shows an approach to prevent a tungsten film from being formed on the sides and rear of a wafer in a CVD apparatus and disclosed in Prior Art 3. As shown, a susceptor 11 is located in a reaction chamber 10 and retains the silicon substrate 1. In this condition, the substrate 1 is heated to 350° C. to 500° C. A shower head 12 is disposed above the susceptor 11 and receives a raw material gas from a piping 16 via a valve 14A. The gas issues from the shower head 12 to form a tungsten film on the front of the substrate 1. To prevent the tungsten film from being formed on the sides and rear of the substrate 1, an argon (Ar) gas or similar inactive gas is fed from a piping 17 to outlet ports 13 via a flow meter 15A, a valve 14B, and passageways formed in the susceptor 11. The reference numeral 19 designates an exhaust port. The problem with Prior Art 3 is that because the inactive gas must be fed from the rear of the substrate 1 at a high flow rate, the thickness of the film is reduced in the peripheral portion of the front of the substrate 1, resulting in an irregular thickness distribution.

Referring to FIG. 4, an apparatus embodying the present invention is shown and implemented as a CVD apparatus. In FIG. 4, the same or similar constituents as the constituents shown in FIG. 3 are designated by like reference numerals. As shown, the CVD apparatus has a reaction chamber 10 in which a susceptor 11 is located. A wafer 1A is held by the susceptor 11. A shower head 12 faces the susceptor 11 and receives a raw material gas from a piping 16 via a valve 14A. Outlet ports 13 are formed in the susceptor 11 in the vicinity of the edges of the wafer 1A in order to jet an inactive gas and an oxidizing gas. The inactive gas implemented by an Ar gas is fed to the outlet ports 13 from an Ar piping 17 via a flow meter 15A and a valve 14B. Likewise, the oxidizing gas implemented by $O_2$ is fed to the outlet ports 13 from an $O_2$ piping 18 via a flow meter 15B and a valve 14C. An exhaust port 19 allows the nonreacted raw material gas to be discharged from the reaction chamber 10. In this configuration, because the oxidizing gas can be fed to the sides of the wafer 1A, it is possible to form an oxide film on the sides and rear of the wafer 1A.

A reference will be made to FIGS. 5A–5C for describing a method of forming a tungsten film and including a method of forming the above oxide film, i.e., an alternative embodiment of the present invention.

Figure 5A:
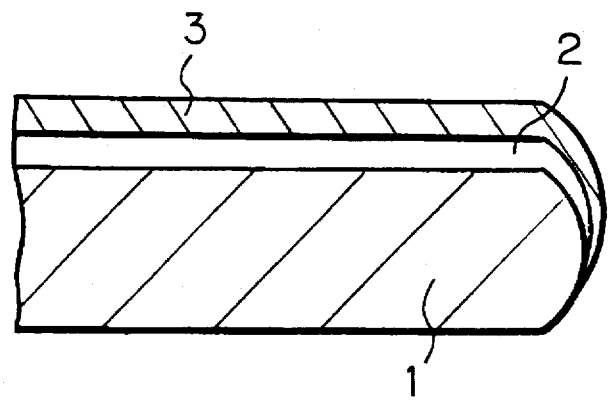
FIG. 5 is a section of a semiconductor chip and showing an alternative embodiment of the present invention.
Figure 5B:
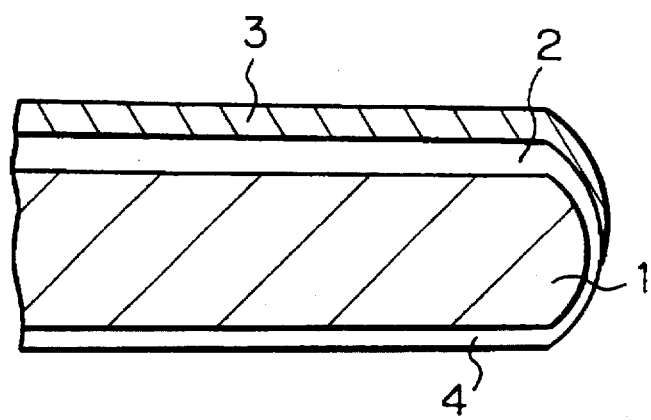
Figure 5C:
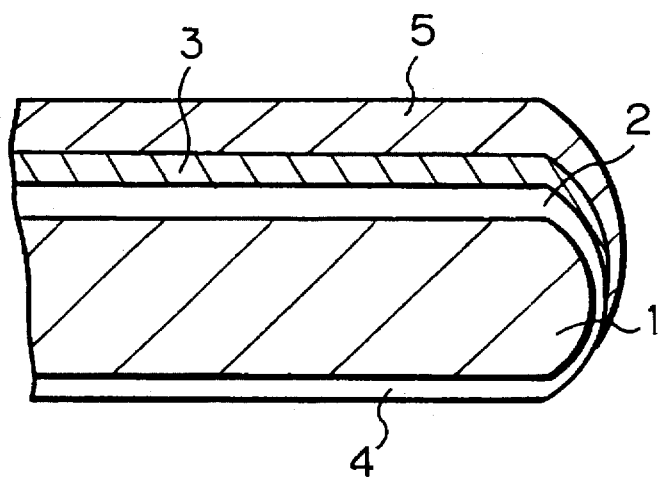

First, as shown in FIG. 5A, a silicon oxide film 2 formed on the silicon substrate 1 is subjected to conventional lithography or dry etching for forming desired contact holes, not shown. An adhesion layer 3 is formed on the silicon oxide film 2 and implemented by a titanium film and a titanium nitride film by way of example. Then, as shown in FIG. 5B, only the sides and rear of the substrate 1 where silicon is exposed are oxidized by the CVD apparatus of FIG. 4. As a result, a several nanometers to tens of nanometers thick silicon oxide film 4 is formed on the above portions of the substrate 1. Subsequently, as shown in FIG. 5C, a tungsten film 5 is formed on the adhesion layer 3 by the CVD process.

How the silicon oxide film 4 and tungsten film 5 are formed will be described more specifically. First, the wafer 1A shown in FIG. 4 is held by the susceptor 11 of the CVD apparatus also shown in FIG. 4. The wafer 1A is heated to 350° C. to 500° C. Then, the oxidizing gas or the mixture of oxidizing gas and inactive gas is jetted from the outlet ports 13 so as to oxidize the sides and rear of the wafer 1A where silicon is exposed. As a result, the thin silicon film 4 is formed on the sides and rear of the wafer 1A. The oxidizing gas may be implemented by oxygen, oxygen-containing inactive gas, oxygen-containing nitrogen, ozone, ozone-containing inactive gas, $N_2O$ gas, or $N_2O$-containing inactive gas by way of example. At this instant, it is necessary to feed Ar or similar inactive gas from the shower head 12 in order to protect the front of the adhesion layer 3 from oxidation.

After the silicon oxide film 4 has been formed on the substrate 1, only the Ar gas is jetted from the outlet ports 13. Subsequently, a gas mixture consisting of 10 sccm to 100 sccm of $WF_6$ and 100 sccm to 2,000 sccm of $H_2$ is fed from the shower head 12 to the front of the wafer 1A, thereby forming the tungsten film 5 thereon. Because the sides and rear of the wafer 1A are covered with the silicon oxide film 4, they are free from an undesirable tungsten film although the raw material gas issuing from the shower head 7 may partly reach them. This obviates particles otherwise resulting from the undesirable tungsten film flaking off. In the illustrative embodiment, Ar or similar inactive gas or oxygen gas is jetted from the outlet ports 13. The flow rate of such a gas should only be, e.g., 500 sccm to 2,000 sccm which does not deteriorate the uniform thickness of the tungsten film 5, because it is not necessary to fully prevent the gas from the shower head 7 from turning round to the sides and rear of the wafer 1A. This reduces the influence of the inactive gas or hydrogen gas on the flow of the raw material gas. Consequently, the raw material gas is allowed to reach even the peripheral portion of the front of the wafer 1A, thereby reducing the difference in film thickness between the central portion and the peripheral portion.

A tungsten film is not formed on the sides and rear of the wafer 1A even when the raw material gas turns round to them, as stated above. This is partly because the amount of the raw material gas reaching the sides and rear of the wafer 1A is small and partly because the sides and rear of the wafer 1A are covered with the silicon oxide film. In this condition, $WF_6$ contained in the raw material gas and the silicon do not react each other. In addition, the surface of the silicon oxide film 4 scarcely adsorbs the raw material gas, compared to the surface of the adhesion layer 3.

As stated above, the illustrative embodiment oxidizes the sides and rear of the wafer 1A so as to form a silicon oxide film, and then forms the tungsten film 5 by the CVD process. Therefore, the film 5 produces a minimum of particles and has a uniform thickness.

While the embodiment forms the oxide film 4 and tungsten film 5 by use of a single apparatus, it may use an exclusive apparatus for each of the two films 4 and 5. The crux is that the silicon surfaces unprotected from the raw material gas be oxidized before the formation of the tungsten film 5. Although the foregoing description has concentrated on the tungsten film 5 as a metal film, the present invention is similarly applicable to the case wherein a titanium, copper or similar metal film is formed by the CVD process.

In summary, in accordance with the present invention, means is provided for adding an oxidizing gas to an inactive gas to be fed to the sides of a wafer. Before a metal film is formed on the front of the wafer, the oxidizing gas oxidizes silicon exposed on the sides and rear of the wafer and unprotected from a raw material gas, thereby forming a silicon oxide film. Hence, even when the metal film is formed on the front of the wafer via an adhesion layer, it is scarcely formed on the sides and rear of the wafer and turns out a minimum of particles. Further, because the metal film is scarcely formed on the sides and rear of the wafer, the inactive gas to be fed from the rear of the wafer during vapor growth can have its flow rate reduced. This successfully enhances the uniform thickness of the metal film on the front of the wafer.

Various modifications will become possible for those skilled in the art after receiving the teachings of the present disclosure without departing from the scope thereof.

What is claimed is:

1. A method of producing a semiconductor device, comprising the steps of:

forming an adhesion layer on a front of a silicon substrate via an oxide film;

forming, after forming said adhesion layer, a silicon oxide film on sides and a rear of said silicon substrate by using an oxidizing gas; and forming a metal film on said adhesion layer by a CVD process while feeding an inactive gas to said sides of said silicon substrate.

2. A method as claimed in claim 1, wherein said silicon oxide film and said metal film are formed in a single apparatus.

3. A method as claimed in claim 1, wherein said oxidizing gas comprises one of an $O_2$ gas, an $O_3$ gas and a $N_2O$ gas, a mixture of said gases, and a mixture of any one of said gases and an inactive gas.

* * * * *